United States Patent [19]

Shimizu

[11] Patent Number: 5,319,764
[45] Date of Patent: Jun. 7, 1994

[54] ADDRESS DETECTION CIRCUIT USING A MEMORY

[75] Inventor: Hiroshi Shimizu, Tokyo, Japan

[73] Assignee: NEC Corporation, Tokyo, Japan

[21] Appl. No.: 690,336

[22] Filed: Apr. 26, 1991

Related U.S. Application Data

[63] Continuation of Ser. No. 258,684, Oct. 17, 1988, abandoned.

[30] Foreign Application Priority Data

Oct. 16, 1987 [JP] Japan .................. 62-260828

[51] Int. Cl.⁵ .................. G06F 12/00; H04J 3/24; G11C 8/00
[52] U.S. Cl. .................. 395/425; 365/189.07; 365/49; 365/230.01; 370/60.1; 370/94.1; 340/825.52; 395/400
[58] Field of Search .................. 365/49, 189.07, 189.08, 365/230.01; 340/825.52, 825.53; 370/60.1, 67, 94.1, 94.2, 85.11, 85.12, 85.13, 85.14, 85.15; 395/425, 400

[56] References Cited

U.S. PATENT DOCUMENTS

| | | | |
|---|---|---|---|
| 4,575,818 | 3/1986 | Almy et al. | 365/49 |
| 4,769,812 | 9/1988 | Shimizu | 370/67 |
| 4,815,071 | 3/1989 | Shimizu | 370/60 |
| 4,907,194 | 3/1990 | Yamada et al. | 365/189.07 |

FOREIGN PATENT DOCUMENTS

2182789  5/1987  United Kingdom .................. 365/49

*Primary Examiner*—Glenn Gossage
*Attorney, Agent, or Firm*—Foley & Lardner

[57] ABSTRACT

An address detection circuit for high speed detection of long addresses which utilizes a memory which is addressable at a shorter address length than the length of the address to be detected includes a subfield address generator which generates N (N being an integer greater than 1) subfield addresses obtained by dividing an input address by N. A subfield indicating signal generator generates a subfield indicating signal for indicating the order in which the N subfields are inputted. The subfield and subfield indicating signal form a memory address, which is generated N times. An address comparator compares the memory addresses and memory addresses stored therein and generates comparison signals. A decision circuit decides that when the comparison signals prove to be identity signals N number of times, the input address represents the address to be detected and generates an address detection signal.

5 Claims, 7 Drawing Sheets

ADDRESS DETECTION CIRCUIT USING A MEMORY

This application is a continuation of application Ser. No. 07/258,684, filed Oct. 17, 1988, now abandoned.

BACKGROUND OF THE INVENTION

The present invention relates to address detection circuits, and more particularly to an address detection circuit for use in communication systems having a plurality of communication nodes wherein communication is controlled on the basis of transmit/receive addresses included in packet signals and the like.

Whereas addresses are used in the reception or routing of packet signals, such processing as address detection and address calculation have conventionally been achieved with a computer. However, real time processing is difficult in this manner because the processing speed is not high enough. Meanwhile, there is proposed an address detection circuit using a memory which compares the addresses of packet signals with addresses stored therein to make real time processing possible. However, when a memory is used for address detection, the number of bits for address representation increases with the extension of the address length, and accordingly the memory capacity has to be increased. Since long addresses, such as 16-bit, 32-bit or even 48-bit ones, are used in local area networks or the like, the memory-based address detection circuit is hardly applicable for practical purposes.

SUMMARY OF THE INVENTION

An object of the present invention is to provide an address detection circuit for high-speed detection of long addresses by the use of a memory which is addressable at a shorter address length than the length of the address to be detected.

An address detection circuit according to the invention comprises a subfield address generator which generates N (greater than 1) subfield addresses obtained by dividing an input address into N subfields. A subfield indicating or indicator signal generator generates a subfield indicating signal for indicating the order in which these N subfields are inputted. The subfield and subfield indicating signal form a memory address, which is generated N times. An address comparator compares the memory addresses and memory addresses stored therein and generates comparison signals. A decision circuit decides that, when the comparison signals prove to be identity signals N number of times, the input address represents the address to be detected and generates an address detection signal.

BRIEF DESCRIPTION OF THE DRAWINGS

The above and other objects, features, and advantages of the present invention will become apparent from the following detailed description when taken with the accompanying drawings in which:

FIGS. 5A to 5K are time charts for explaining the operation of the first preferred embodiment.

DETAILED DESCRIPTION OF THE PREFERRED EMBODIMENTS

Figure 1:
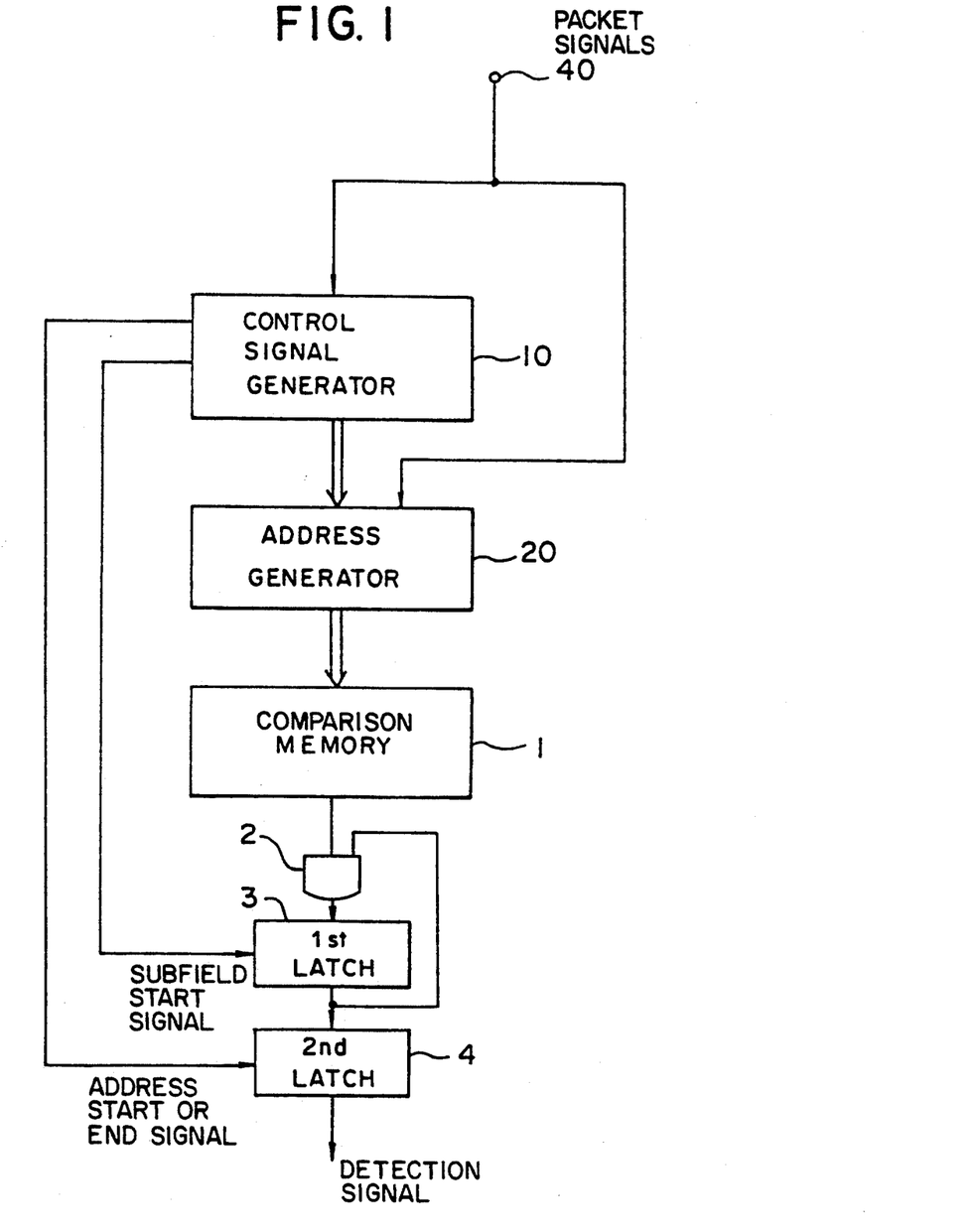
FIGS. 1 and 6 are block diagrams illustrating first and second preferred embodiments, respectively, of the invention.

FIG. 1 is a block diagram illustrating a first preferred embodiment of the present invention.

Referring to FIG. 1, packet signals including the address (input address) are supplied by way of a terminal 40 to an address generator 20 and a control signal generator 10. A packet signal is well known to include a flag bit for indicating the start of a packet, address of the destination and origin, information data and a check code for error detection of a packet. The control signal generator 10, as will be described in further detail below, generates various control signals. These control signals include an address start signal for indicating the start of the input address, an address end signal for indicating the end of the input address, a subfield indicating or indicator signal for indicating the order of subfield addresses, a timing signal for a register, and a group indicator for indicating whether the input address is a group address or an individual address.

The address generator 20, in response to the input address and the address start signal supplied from the control circuit 10, generates a memory address for a memory 1 and provides it to the memory 1. The memory address comprises a subfield address obtained by dividing the input address into N (greater than 1) subfields and a subfield order indicator signal for indicating the position of the subfield address relative to the leading subfield address. The memory 1 compares the input memory address and a memory address stored therein, and supplies the result of comparison to a first latch circuit 3 by way of an AND gate 2.

The first latch circuit 3, responding to the subfield start signal from the control circuit 10, latches the output of the AND gate 2 and supplies the latched output to a second latch circuit 4. Each of the latch circuits 3 and 4 is a trailing-edge-triggered latch circuit. Both latch circuits 3 and 4 input data on a falling (trailing) edge of their respective clock signal inputs. The second latch circuit 4, responding to the address start or end signal from the control circuit 10, latches the output of the first latch circuit 3, and outputs the latched signal as the result of detection of the input address. Upon outputting of the detection signal of the input address, a communication node (not shown) receives the packet signal and processes it.

Figure 2:
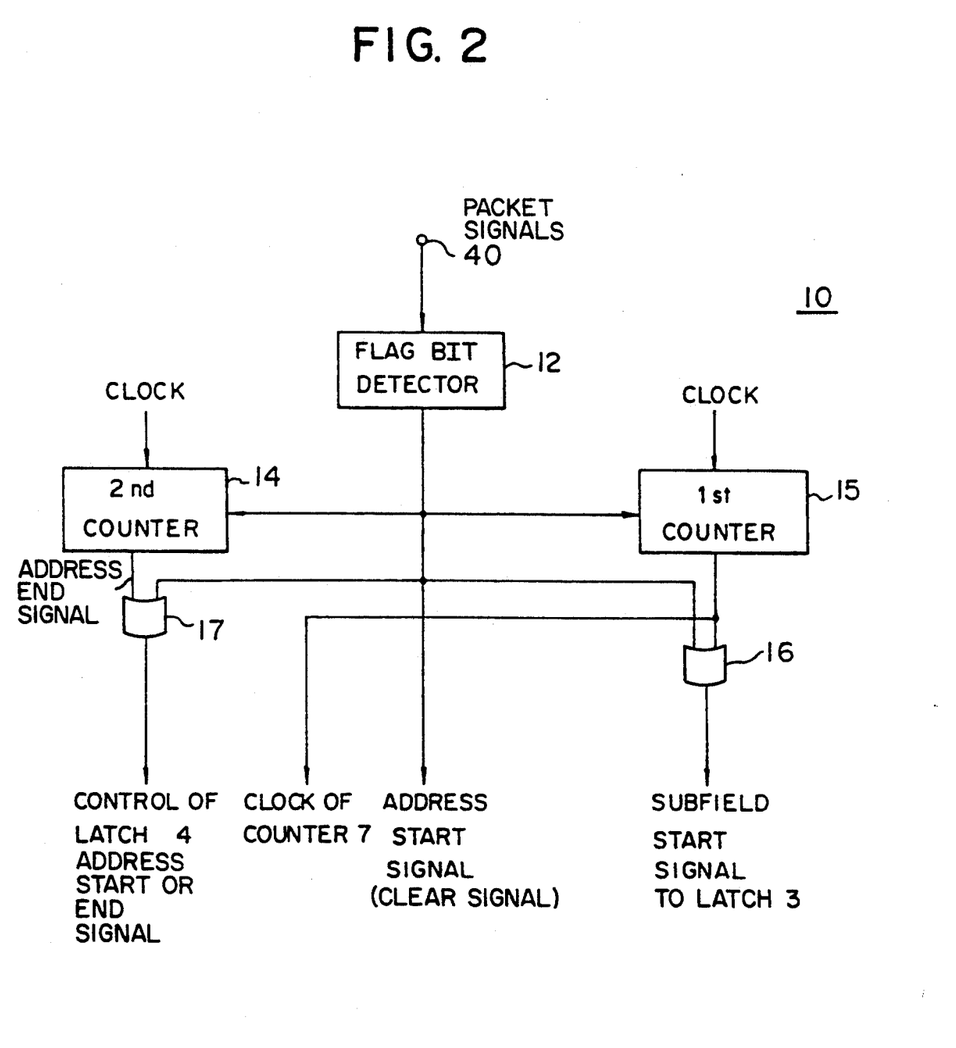
FIGS. 2, 3, 7 and 8 are circuit diagrams each illustrating a part of the invention.

FIG. 2 is a block diagram illustrating an example of the control signal generator 10. In FIG. 2, the control signal generator 10 has a flag bit detector 12 for detecting a flag bit from the packet signal and outputting it as an address start signal for indicating the start of the input address, and a second counter 14 for counting clocks to a prescribed value corresponding to the length of the input address and generating the address end signal for indicating the end of the input address. The control circuit 10 further includes a first counter 15 for counting clocks to another prescribed value corresponding to the length of the subfield address and generating clock pulses for a third counter 7 of FIG. 3, and an OR circuit 16 for generating the subfield start signal indicative of the start of a subfield by combining the address start signal and the output of the first counter 15. An OR gate 17 combines the address start signal and the address end signal to generate an address start or signal for controlling the latch circuit 4. The address start signal is supplied, as a clear signal, or a reset signal, to the counters 14 and 15, as well as to the third counter 7 and a serial-to-parallel (S/P) converter 8, both to be described in further detail below. The address start signal is also used as an initialization signal for the latch circuits 3 and 4.

The address start signal is inputted to a set signal terminal of the latch circuit 3 and a reset signal terminal of the latch circuit 4. Thus, the latch circuit 3 is set to a logic "1" and the latch circuit 4 is set to a logic "0" during initialization, irrespective of the data input to these circuits.

Figure 3:
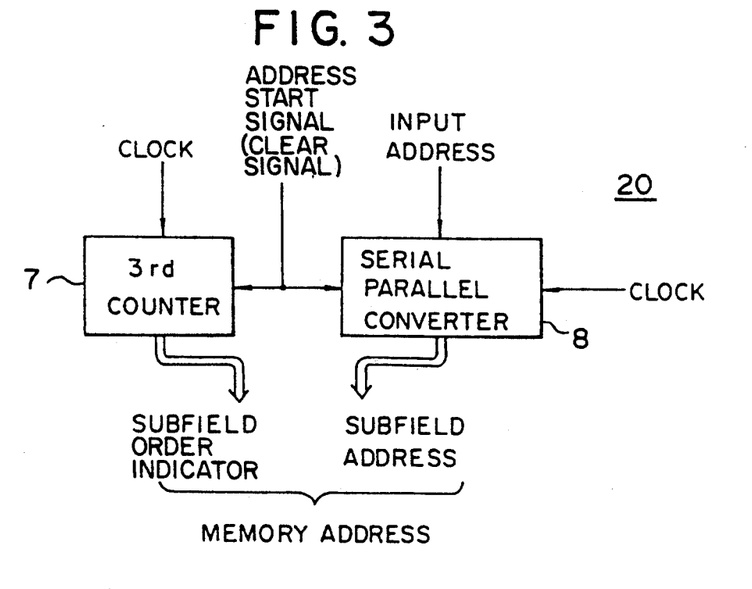

Referring to FIG. 3, the address generator 20 comprises the third counter 7 responsive to the clock pulses from the first counter 15 for generating the subfield indicating order or indicator signal for indicating the order of subfields, and the S/P converter 8 for generating subfield addresses from the input address signal.

Figure 4:
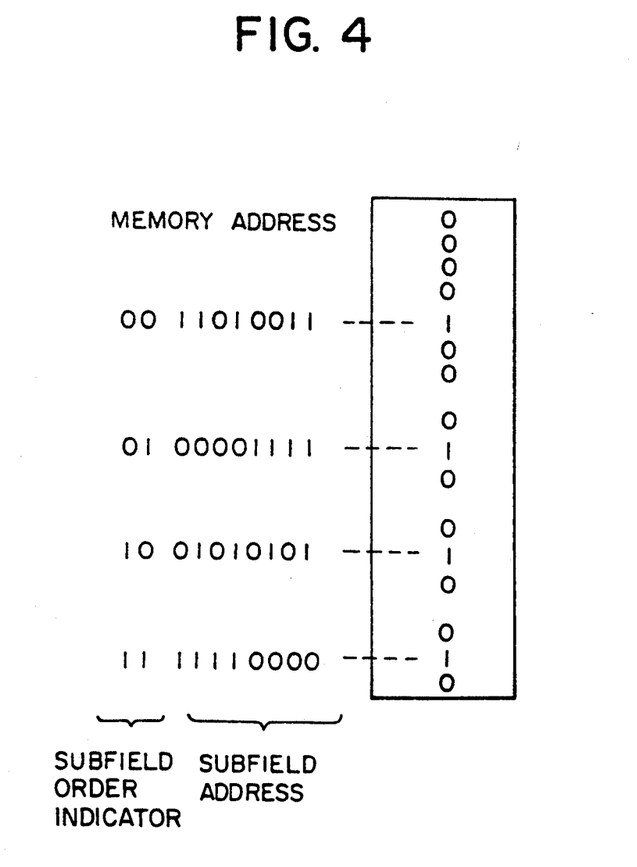
FIG. 4 illustrates an example of data stored in the memory 1 of FIG. 1.

Next will be described the operation of the first preferred embodiment illustrated in FIG. 1 with reference to FIGS. 2, 3, 4 and 5A to 5J. It is now supposed that the address to be detected (set address) consists of four eight-bit subfield addresses including (1) 11010011, (2) 00001111, (3) 01010101 and (4) 11110000. The memory address in the memory 1, as stated above, consists of a total of 10 bits including eight bits of a subfield address and two bits of a subfield indicator signal. Therefore, to detect the set address, the memory 1 is programmed so that "1" is stored in each of the memory cells of memory addresses [00 11010011], [01 00001111], [10 01010101] and [11 11110000], which correspond to the subfield addresses of the set address, and "0", in every other memory cell, as shown in FIG. 4.

Figure 5A:
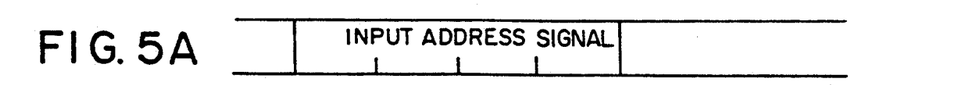
Figure 5B:
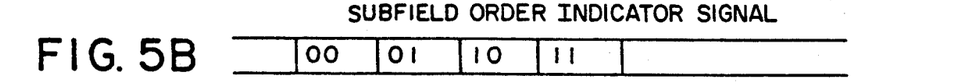
Figure 5C:
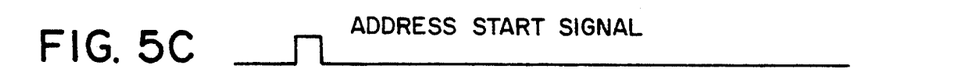
Figure 5D:
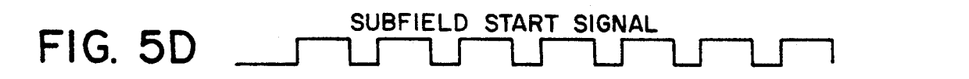
Figure 5E:
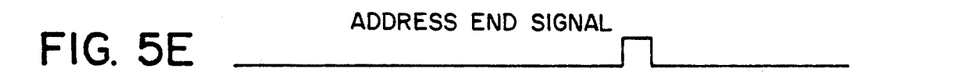
Figure 5F:
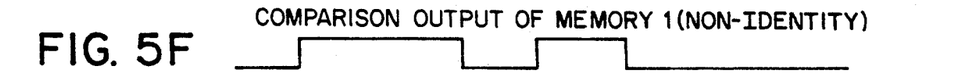
Figure 5G:
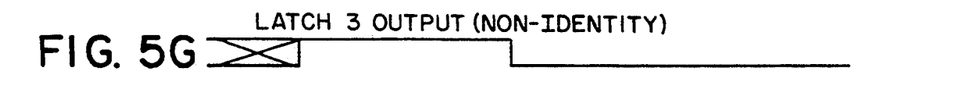
Figure 5H:
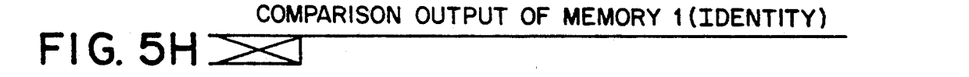
Figure 5I:
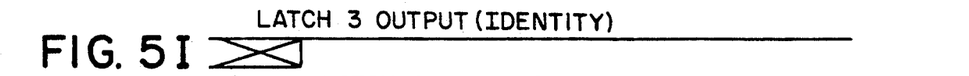
Figure 5J:
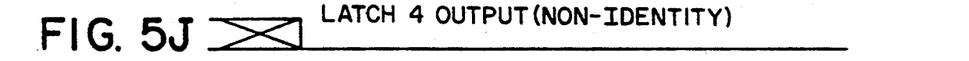
Figure 5K:
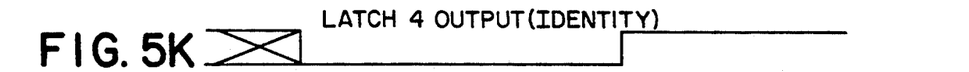

It is further supposed that, in this state, packet signals having an input address 11010011 00001111 10101010 11110000 (FIG. 5A), whose third subfield differs from that of the set address, are inputted. The control circuit 10 generates the address start signal (FIG. 5C) in accordance with the flag bit of the packet signals. In response to the address start signal, the counter 7, and the latch circuits 3 and 4 are initialized to "00", "1" and "0", respectively. As the counter 7 is set at "00" by the address start signal, the memory 1 receives the subfield order address indicating or indicator signal "00" (FIG. 5B) and the first subfield 11010011 as the memory address. Since, in this case, the subfield address stored in the memory 1 and the first input subfield address are identical as shown in FIG. 4, the memory 1 supplies an identity signal to the gate 2 as shown in FIG. 5F. As the latch circuit 3 is initialized to "1", the identity output of the memory 1 is latched by the latch circuit 3 in response to the subfield start signal (FIG. 5D) as shown in FIG. 5G. Thus the latch circuit 3 retains the state of "1". Then, the output of the counter 7 is updated from "00" to "01", and the second subfield address is supplied to the memory 1. As, in this case again, the second subfield address is identical with the stored second subfield address, the latch circuit 3 maintains "1". However, the next third subfield address is not identical with the stored third subfield address, so that the memory 1 supplies a nonidentity signal "0" (FIG. 5F) at this time. As a result, the output of the gate 2 turns "0", and so does the value retained by the latch circuit 3 in response to the subfield start signal. Even if the fourth subfield is identical with the stored subfield address, the gate 2 outputs "0" and the latch circuit 3 maintains "0" as the output of the latch circuit 3 is "0". The latch circuit 4 latches the output of the latch circuit 3 in response to the address end signal 22 (FIG. 5E) (through OR gate 17) (FIG. 5E), and outputs the result of the decision as to the non-identity (FIG. 5J) of the input address. As, in this case, the third subfield address is not identical, "0" is latched as the result of the decision. When the address to be detected is inputted and the identity signal "1" is supplied by the memory 1 for every one of the four subfield addresses as shown in FIG. 5H, the output of the latch circuit 3 remains "1" as shown in FIG. 5I. Therefore, a "1" signal, indicating the inputting of the address signal to be detected, is outputted by the latch circuit 4 as shown in FIG. 5K.

Figure 6:
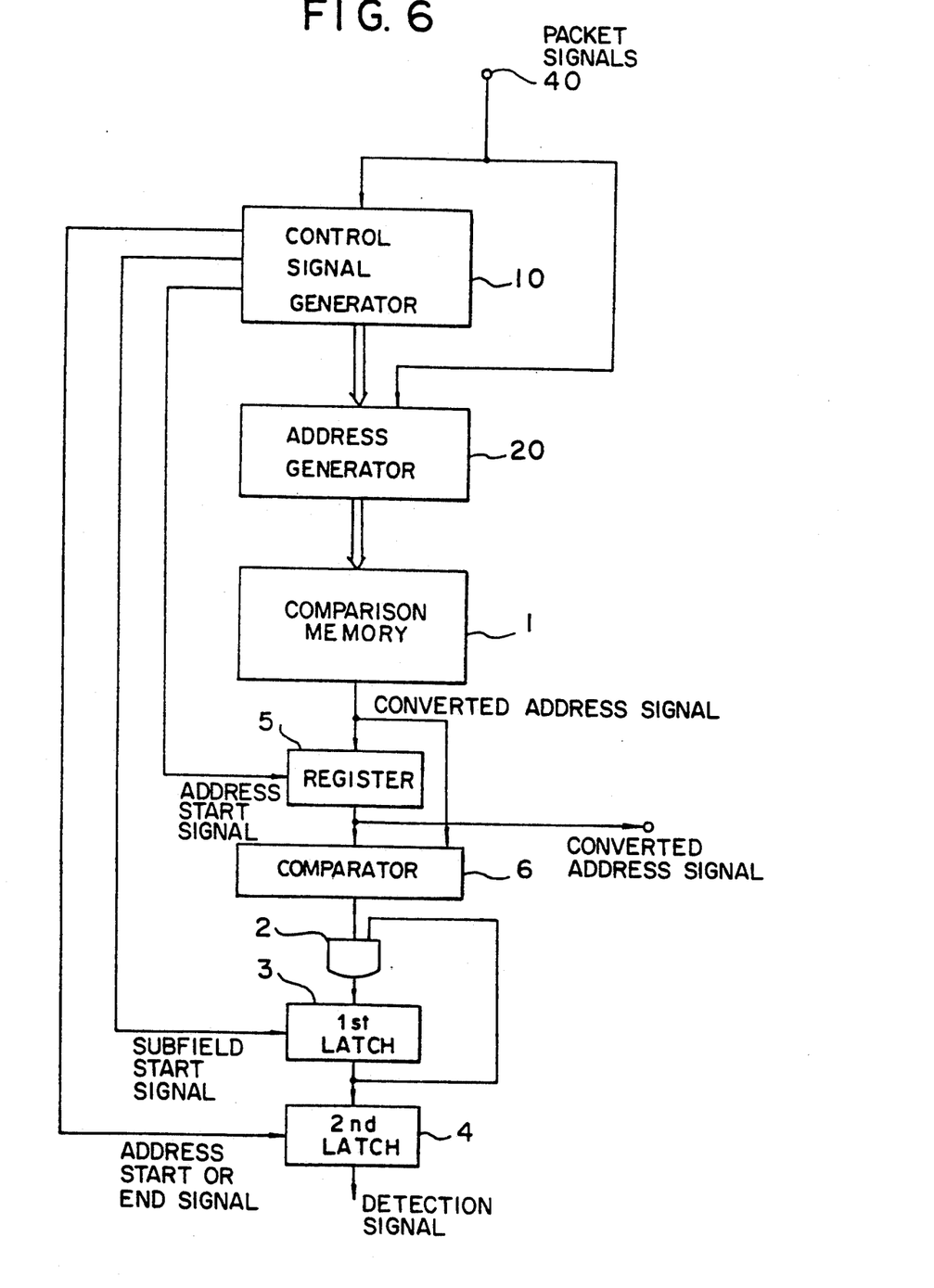

FIG. 6 is a block diagram illustrating a second preferred embodiment of the present invention, having the function of comprising the detected address into a shorter address. In FIG. 6, the second preferred embodiment of the invention has a register 5 for temporarily storing the output of the memory 1 and a comparator 6 for comparing the content of the register 5 and the output of the memory 1 for the purpose of address conversion in addition to the structural elements shown in FIG. 1.

Next will be described the operation of the second embodiment illustrated in FIG. 6. It is now supposed that the 32-bit address to be detected consists of four subfields including (1) 11010011, (2) 00001111, (3) 01010101 and (4) 11110000, and that this address is to be converted into 1100. In this case, 1100 is stored in memory cells [00 11010011], [01 00001111], [110 01010101] and [11 11110000], and 0000, in every other cell. Therefore, the memory 1 will output 1100 if input subfield addresses are identical with the stored subfield addresses, or 0000 if not. The register 5 stores the conversion result of the first subfield address. This stored result is retained throughout the duration of address detection. If the first subfield address is identical with the stored first subfield address and at least one of the second and subsequent subfield addresses is not, the comparator 6 will output "0". As a result, through an operation similar to that of the first preferred embodiment, the output of the gate 2 turns "0", as does the value retained by the latch circuit 3, and the latch circuit 4 outputs "0", the result of the decision indicating non-identity. When the input address to be detected is inputted, the value 1100 is stored in the register 5, the comparator 6 outputs "1", the output of the latch circuit 4 turns "1", and 1100 stored in the register 5 is outputted as a converted address signal. If the first subfield address does not prove identical, the value stored in the register 5 will be 0000, so that non-identity can be recognized irrespective of the value of the latch circuit 4.

Figure 7:
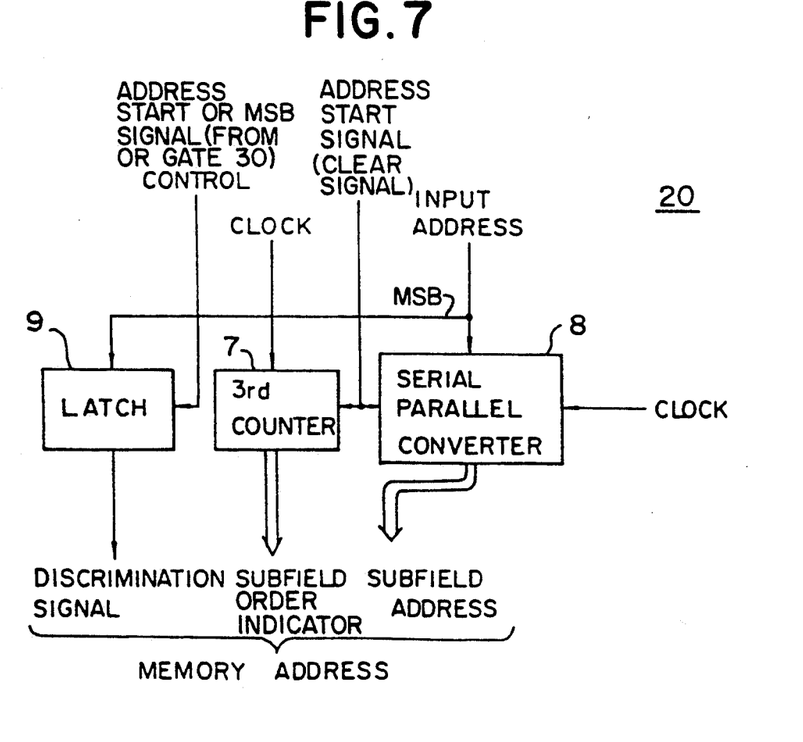

FIG. 7 is a block diagram illustrating another example of the memory address generator 20, which is applicable to detection of two types of addresses, individual addresses and group addresses.

Referring to FIG. 7, the address generator 20 has, in addition to the structural elements shown in FIG. 3, a latch circuit 9 for storing a discrimination signal for indicating whether the input address is an individual address or a group address. In this example, the discrimination signal is represented by the most significant bit (MSB).

Figure 8:
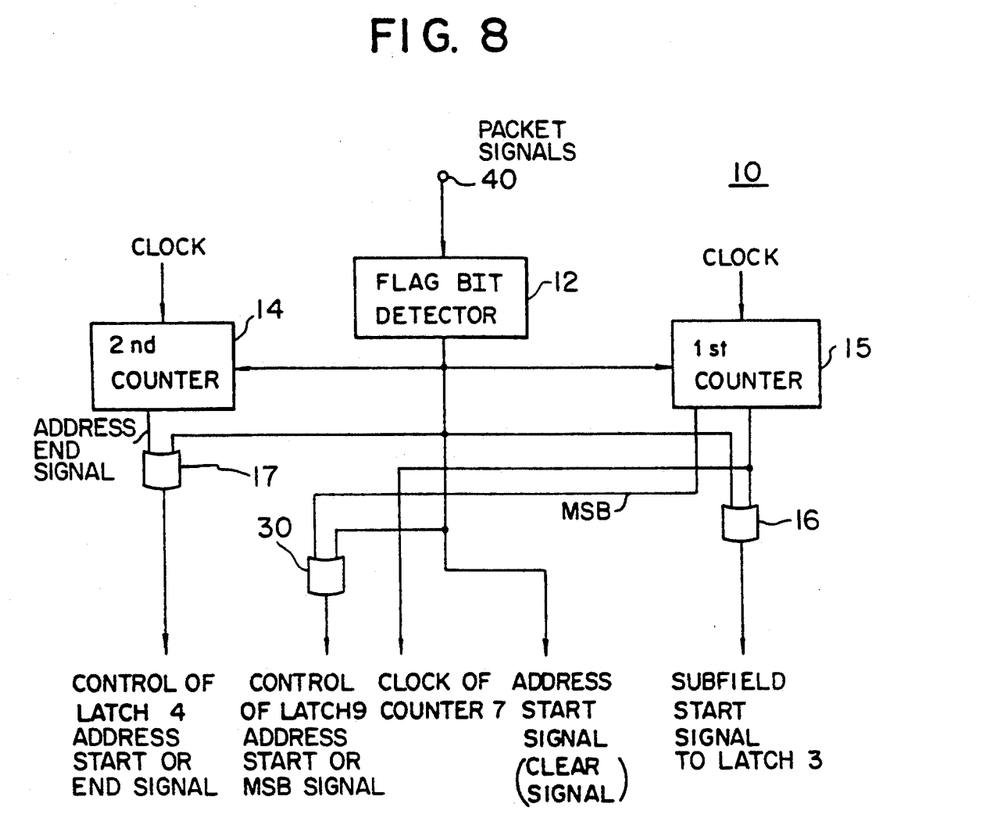

FIG. 8 is a block diagram illustrating another example of the control signal generator 10 which is suitable for the memory address generator 20 shown in FIG. 7. Referring to FIG. 8, the control circuit 10 has, in addition to the structural elements shown in FIG. 2, an OR gate 30 for controlling the latch circuit 9 used for the discrimination signal. The OR gate 30, besides initializing the latch circuit 9 by combining the address start signal and the first bit of the first counter 15, generates a timing signal for storing the first bit of the input address.

Next will be described the operation which takes place when the structures of FIGS. 7 and 8 are applied to the second preferred embodiment of FIG. 6. Now is considered, as the addresses to be detected, a group address consisting of 01010011, 00001111, 01010101 and 11110000, in which the MSB is set at "0", and the individual address used in the example of FIG. 1. As stated above, in detecting individual and group addresses, a memory address consists one bit of a discrimination signal, two bits of a subfield address indicating signal, and eight bits of a subfield address, or a total of 11 bits. Consequently, the memory 1 is so programmed that "1" is stored in each one of the memory address cells (000 01010011), (100 01010011), (001 00001111), (101 00001111), (010 01010101), (110 01010101), (011 11110000) and (111 11110000), and "0", in every other cell. Among the 11-bit memory addresses, those whose MSB is "0" are subfield addresses belonging to the group address category. Referring to FIG. 7, the latch circuit 9 latches the discrimination signal "0" in response to a timing signal from the OR gate 30 (FIG. 8), and retains it for the duration of four subfield addresses. The counter 7 and S/P converter 8, as in the preferred embodiment of FIG. 1, generate the subfield indicating signals and subfield addresses. The memory 1 outputs an identity signal "1" in response to a memory address when the input subfield address and the subfield address stored therein are identical. Description of the subsequent operation, which is the same as that of the embodiment of FIG. 1, is dispensed with herein.

Where the structures of FIGS. 7 and 8 are applied to FIG. 2, similarly, individual and group addresses can be converted into shorter addresses of prescribed forms.

As hither to described, the present invention makes possible high-speed detection, or conversion into shorter addresses, of long addresses with a memory of small memory capacity. For instance, whereas the prior art requires $2^{32}$=4-gigabit and four times as large or 16-gigabit memories to realize the same functions as the first and second preferred embodiments, respectively, of the present invention, the memory 1 hereunder requires 4 kilobits and 16 kilobits for the two embodiments, respectively, resulting in significant savings in memory capacity.

What is claimed is:

1. An address detection circuit for detecting an address, comprising:
    memory address signal generating means for receiving an input address signal and for generating a memory address signal, said memory address signal including N subfield address signals, where N is an integer greater than 1, and respective N subfield indicating signals,
    said N subfield address signals being obtained by said generating means dividing said input address signal into N subfields, and
    said N subfield indicating signals being respectively indicative of an order in which said N subfields occur in said input address signal;
    memory means for comparing said memory address signal with a memory address signal stored in said memory means, one subfield address signal at a time in a sequence in accordance with the order indicated by said subfield indicating signals, and for generating a comparison signal; and
    decision means for deciding that, when said comparison signal is an identity signal N consecutive times, one for each of said subfield address signals, said input address signal represents the memory address to be detected, and for generating an address detection signal.

2. An address detection circuit, as claimed in claim 1, wherein said decision means comprises an AND gate receiving at one input said comparison signal from said memory means, first latch means for latching an output of said AND gate and supplying a latched signal from an output of said first latch means to another input of said AND gate; and second latch means for latching said output of said first latch means in response to a signal indicating an end of said input address signal.

3. An address detection circuit, as claimed in claim 1, wherein said decision means comprises:
    register means for storing a first comparison signal from said memory means in order to generate a reference signal;
    comparing means for comparing second through N-th comparison signals from said memory means with said reference signal to generate a second comparison signal;
    an AND gate receiving at one input said second comparison signal from said comparing means;
    first latch means for latching an output of said AND gate and supplying a latched signal from an output of said first latch means to another input of said AND gate; and
    second latch means for latching said output of said first latch means in response to a signal indicating an end of said input address signal.

4. An address detection circuit, as claimed in claim 1, wherein said memory address signal generating means comprises subfield address signal generating means for generating said N subfield address signals and subfield indicating signal generating means for generating said N subfield indicating signals.

5. An address detection circuit, as claimed in claim 4, wherein said memory address signal generating means further includes a most significant bit (MSB) storing circuit for storing a MSB of said input address signal and generating an MSB discrimination signal, said MSB discrimination signal being included in said memory address signal.

* * * * *